United States Patent [19]

Hill

[11] Patent Number: 4,949,386

[45] Date of Patent: Aug. 14, 1990

[54] SPEAKER SYSTEM

[76] Inventor: Amel L. Hill, 3290 Progress Dr., Ste. 160, Orlando, Fla. 32826

[21] Appl. No.: 197,324

[22] Filed: May 23, 1988

[51] Int. Cl.[5] .......................... H04R 1/02; H04R 1/28; H05K 5/06

[52] U.S. Cl. .................................... 381/188; 181/149; 181/150; 181/156; 181/199; 381/153; 381/189; 381/205

[58] Field of Search ...................... 381/188, 87, 88, 90, 381/153, 154, 159, 189, 205; 181/149, 150, 156, 199

[56] References Cited

U.S. PATENT DOCUMENTS

| | | | |
|---|---|---|---|
| 2,210,477 | 8/1940 | Benecke et al. | 181/150 |
| 2,346,226 | 4/1944 | Marlow | 381/189 |
| 2,718,931 | 9/1955 | Boudouris | 181/149 |
| 3,108,653 | 10/1963 | Valldeperas | 181/150 |
| 3,391,754 | 7/1968 | Montanaro | 381/189 |
| 3,642,091 | 2/1972 | Nohara et al. | 181/150 |
| 3,674,108 | 7/1972 | Beatty | 181/149 |
| 3,727,719 | 4/1973 | Yando | 381/153 |
| 3,789,166 | 1/1974 | Sebesta | 381/189 |
| 3,953,566 | 4/1976 | Gore | 264/127 |
| 3,987,258 | 10/1976 | Tsutsui et al. | 381/189 |
| 4,071,111 | 1/1978 | Croup | 181/149 |
| 4,194,041 | 3/1980 | Gore et al. | 264/127 |
| 4,298,087 | 11/1981 | Launay | 181/156 |
| 4,440,260 | 4/1984 | Jacobsen | 381/159 |
| 4,539,698 | 9/1985 | Katz et al. | 381/70 |
| 4,574,906 | 3/1986 | White et al. | 181/155 |
| 4,620,317 | 10/1986 | Anderson | 381/90 |
| 4,754,852 | 7/1988 | Mulé et al. | 181/149 |

FOREIGN PATENT DOCUMENTS

| | | | |
|---|---|---|---|
| 141746 | 5/1980 | German Democratic Rep. | 381/189 |
| 106424 | 11/1963 | Netherlands | 381/88 |
| 582593 | 11/1977 | U.S.S.R. | 381/189 |

OTHER PUBLICATIONS

*Audio Engineering,* "Ground Speakers", David Scott, Oct. 1949, pp. 18–19.

Recreonics Inc., Bid Specifications and Catalog Sheet, Nos. 85A and 77C.

Paramount Sound Systems GS-3 Omnispeaker Specification Sheet.

*Primary Examiner*—Jin F. Ng

*Assistant Examiner*—Danita R. Byrd

*Attorney, Agent, or Firm*—William M. Hobby, III

[57] ABSTRACT

A waterproof ground audio speaker apparatus has a speaker housing having a cylindrical sidewall, one open end and a closed end. A hollow cylindrical inner housing has a pair of open ends and is attached to the speaker housing with its walls in a spaced relationship to the walls of the speaker housing to form a passageway between the walls of the inner housing and the walls of the speaker housing. A loud speaker is mounted in the hollow inner housing facing one open end thereof for directing acoustical energy out the open end of the speaker housing and directing the backwave of the speaker through the hollow inner housing and through the passageway between the inner housing and the speaker housing to the open end of the speaker housing. A rigid domed supporting cover extends over the opening of the speaker housing and a filter membrane cover covers the open end of the speaker housing to protect the inside of the speaker enclosure. Annular flanges on either end of the speaker housing helps support the speaker housing in the earth and a special filter membrane made of laminated polyester and a polytetrafluoroethylene (TEFLON) sheet which allows the acoustical energy to pass therethrough while blocking the ingress of fluids and other materials into the speaker housing.

12 Claims, 1 Drawing Sheet

SPEAKER SYSTEM

BACKGROUND OF THE INVENTION

The present invention relates to a waterproof in-the-ground audio speaker enclosure for mounting in the earth and which disperses acoustical energy therefrom while providing a protective cover thereover.

In the past, a wide variety of audio speakers or transducers have been provided in a variety of enclosures. These include acoustical enclosures which seal the air in the enclosure so that the motion of a speaker therein is pneumatically suspended and expands and contracts of the air in the enclosure responsive to the movement of the speaker. More commonly, speakers have been mounted in enclosure in which the backwave of the speaker is ported with a port of predetermined size and shape relative to the size of the enclosure to allow the bass frequencies produced by the backwave of the speaker to emanate out of the speaker enclosure substantially in phase with the bass signal from the front of the speaker to thereby enhance the bass output of the speaker. This type of speaker is commonly referred to as a Bass Reflex Speaker. Speakers systems may have more than one speaker to cover different frequency ranges and may have crossovers to allow each speaker to only work within a limited frequency range. Weatherproof speakers have been widely provided for in the past and typically include a weatherproof enclosure which may be made of aluminum or of a polymer. A speaker having a cone and diaphragm of a waterproof polymer material is mounted in the enclosure. Such speakers are made as acoustic suspension speakers and the inside is sealed from the exterior and all exterior elements are impervious to moisture on the outside of the speaker. The speaker wire entering the speaker is sealed to prevent the ingress of moisture at this point. Speakers and transducers are also made for underwater use, especially in communications and there have been a variety of speakers made for in the earth placement. This type of speaker system may be an acoustic suspension having a waterproof cone and cover to protect the speaker or as in the present case may have a ported output for the acoustic energy generated on the backside of the loud speaker.

The present invention is directed towards an earth mounted loudspeaker in which a special protective rigid cover is mounted over the top of the earth mounted speaker and a filter membrane mounted thereunder prevents the ingress of moisture, fluids, or other materials, while acting as an acoustic lens for dispersing the higher frequencies of the audio output from the speaker. The speakers are formed with a housing having annular flanges, top and bottom, for giving additional support in the earth.

SUMMARY OF THE INVENTION

The present invention relates to a waterproof ground audio speaker having a cylindrical speaker housing formed of a polymer material having a cylindrical wall and a pair of ends, one of which is closed and the other of which is open. A hollow cylindrical inner housing has a pair of open ends and is mounted to the speaker housing with its walls in a spaced relationship to the walls of the speaker housing to form a passageway between the walls of the inner housing and the inner walls of the speaker housing. A loud speaker is mounted in the hollow cylindrical inner housing facing the open end thereof and the backwave of the speaker is ported through the inner housing and through a passageway between the walls of the inner housing and the walls of the speaker housing to the open end of the speaker enclosure. A rigid domed supporting cover of perforated aluminum extends over the cover of the speaker housing and a filter membrane cover attaches to a membrane support frame under the domed cover for blocking the ingress of fluid and solid materials into the speaker enclosure, while dispersing the higher frequencies of the output of the speaker. The speaker housing has a pair of exterior annular flanges on each end thereof for supporting the speaker housing in the earth. The filter membrane is a laminated Polyester fabric with a Polytetrafluoroethylene (TEFLON) sheet membrane supported on a metal framework. The speaker housing has an annular groove in the bottom thereof with a smoothly curved central knob protruding therefrom and the inner housing has an annular enlarged edge protruding into the annular groove to form a smooth arcuate passageway from the inside of the inner housing to the passageway between the inner housing and speaker housing. An opening in the wall of the speaker housing allows a passageway for speaker wires and may have a threaded protrusion for attaching a threaded cap to form a compression seal to prevent the ingress of moisture through the opening for the speaker wire. The inner housing is supported to the outer housing through a plurality of support members supporting one in a spaced relationship to the other.

BRIEF DESCRIPTION OF THE DRAWINGS

Other objects features and advantages of the present invention will be apparent from the written description and the drawings in which.

DESCRIPTION OF THE PREFERRED EMBODIMENT

Figure 1:
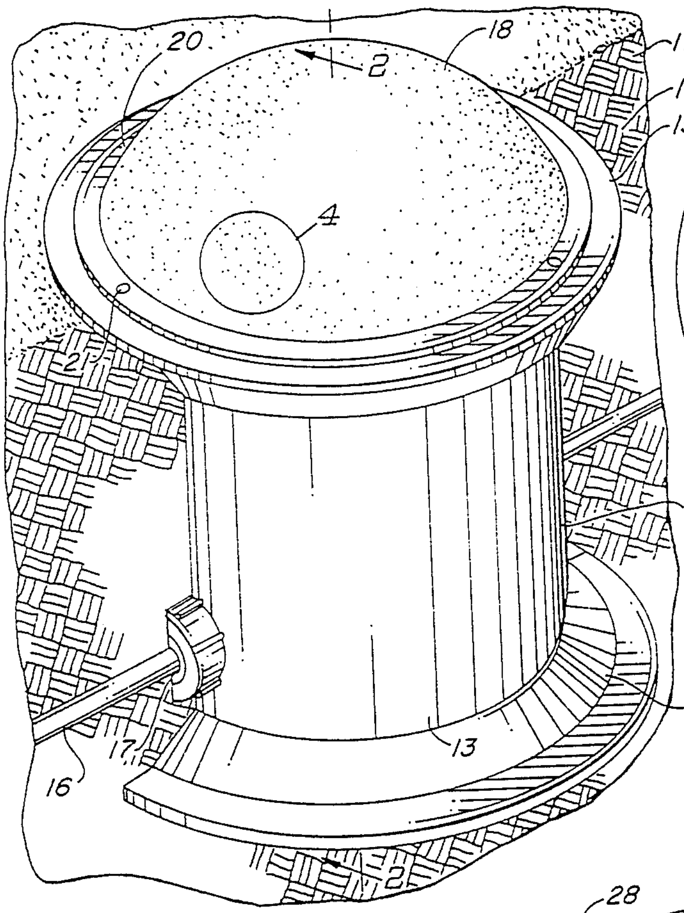
FIG. 1 is a perspective view of a waterproof ground audio speaker in accordance with the present invention, mounted in the earth.
Figure 3:
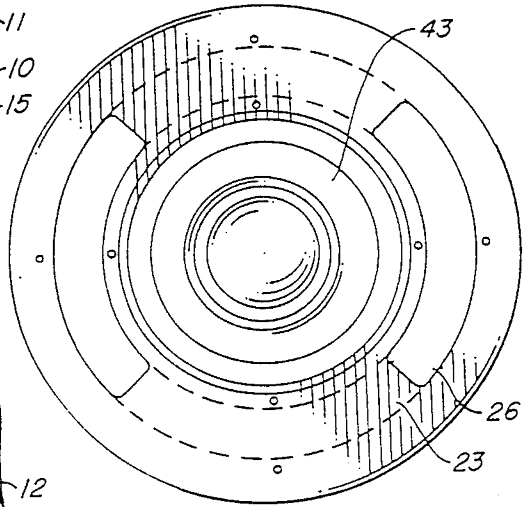
FIG. 3 is a sectional view taken on a line 3—3 of FIG. 2.

Referring to the drawings and especially to FIG. 1, a waterproof ground audio speaker 10 is mounted in the earth 11 and has a speaker enclosure housing 12 having cylindrical walls 13 and a bottom. A bottom annular flange 14 and top annular flange 15 support the speaker in the earth 11. A speaker wire 16 may be connected from an audio amplifier through an opening 17 into the speaker enclosure 12. The audio speaker 10 as shown in FIG. 1 has a rigid supporting cover 18 formed in a dome shape with an annular flange 20 bolted to the flange 15 of the speaker enclosure housing 12 with screws 21. Inside the speaker enclosure, a cylindrical hollow inner housing 22 is mounted in a spaced relationship to the outer housing 12 with support members 23. The inner housing has an acoustic loud speaker 24 mounted therein with screws 25 and 28 and facing the open end 26 of the speaker housing 12. The audio speaker housing 12 has a rigid domed shaped supporting cover 27 mounted thereon and mounted with the same screws 25 and 28 that support the speaker 24 to the inner housing 22. The speaker 24 is connected by a pair of speaker wire conductors 30 which pass through an opening 31 having a protruding threaded seal 32 with a sealing compression cap 33 which seals the opening 17 from the ingress of moisture. A membrane filter 34 is mounted inside the support cover 18 and over the support cover 27 and is supported with the same screws 21 that support the support cover 18 to the speaker housing 12. This membrane disperses the higher frequencies of the acoustic energy emanating from the speaker 24 while preventing the ingress of any moisture or other materials into the speaker enclosure 12. The inner housing 22 may be cylindrical in shape and have an enlarged cylindrical bottom end 35 which matches the bottom 36 of the enclosure 12 which has an annular groove 37 therearound formed with a smooth protruding knob 38 in the center of the bottom 36. The enlarged annular portion 35 of the inner wall 22 protrudes into the groove 37 to form a smooth passageway 40 from the inner chamber 41 and the inner housing 22 to the passageway 42 between the exterior walls of the inner housing 22 and the interior walls of the speaker housing 12. The donut shaped passageway 40 diminishes the back pressure by creating a vortex effect which redirects the reflected wave back into itself and subsequently into the fiberous filler that is used to absorb those vibrations. In ordinary loudspeaker enclosures these are reflected off parallel walls, or any parallel or perpendicular surfaces, resulting in standing waves being created. This passageway 42 which is an annular passageway, terminates at the opening 26 of the speaker housing 12 and partially surrounding the mounted speaker 24 so that the backwave or at least the lower frequencies of the backwave are ported through the passageway to emanate around the speaker 24 front 43. The port is shaped and has a length such as to change the phase 180° of the acoustical energy emanating from the rear of the speaker 43 so as to be substantially in phase with the acoustical energy emanating from the front 43 of the speaker 24. To enhance the lower frequencies of the speaker output, as shown in FIG. 3, the speaker wires 30 may be connected at 44 to speaker wires 45 which continue on through a second opening 46 having a compression cap 47 for sealing the opening thereto where a series of speakers 10 are mounted in series to simultaneously produce speaker output from a variety of positions.

The filter membrane in the in-ground speaker is made of a two layer 100% Polyester woven or nonwoven fabric, 2.9 ounce weight with a substrate layer with a 1.0 micron pore size. This is a Gore-Tex membrane which has a minimum water entry pressure of 10 psi and a porosity of 95%. The membrane can also be made of a two-layer 100% polyester woven fabric, 1 ounce with a 3.0 micron meter pore size, minimum water entry pressure of 2 psi and a porosity of 95%. All membranes use a substrate layer made of filmed TEFLON.

Fabrics of 0.5 to 2.9 ounce weights with a pore size for the substrate of 1.0 micrometer to 3.0 micrometers are the parameters of this membrane. A woven or nonwoven Polyester can be used or any fabric that will allow a Polytetrafluoroethylene substrate layer to be attached to it. This fabric in turn is ultrasonically attached to the skeleton or filter frame support.

Figure 4:
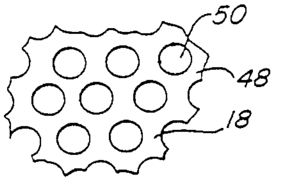
FIG. 4 is a sectional view taken on the circle 4 of FIG. 1.
Figure 2:
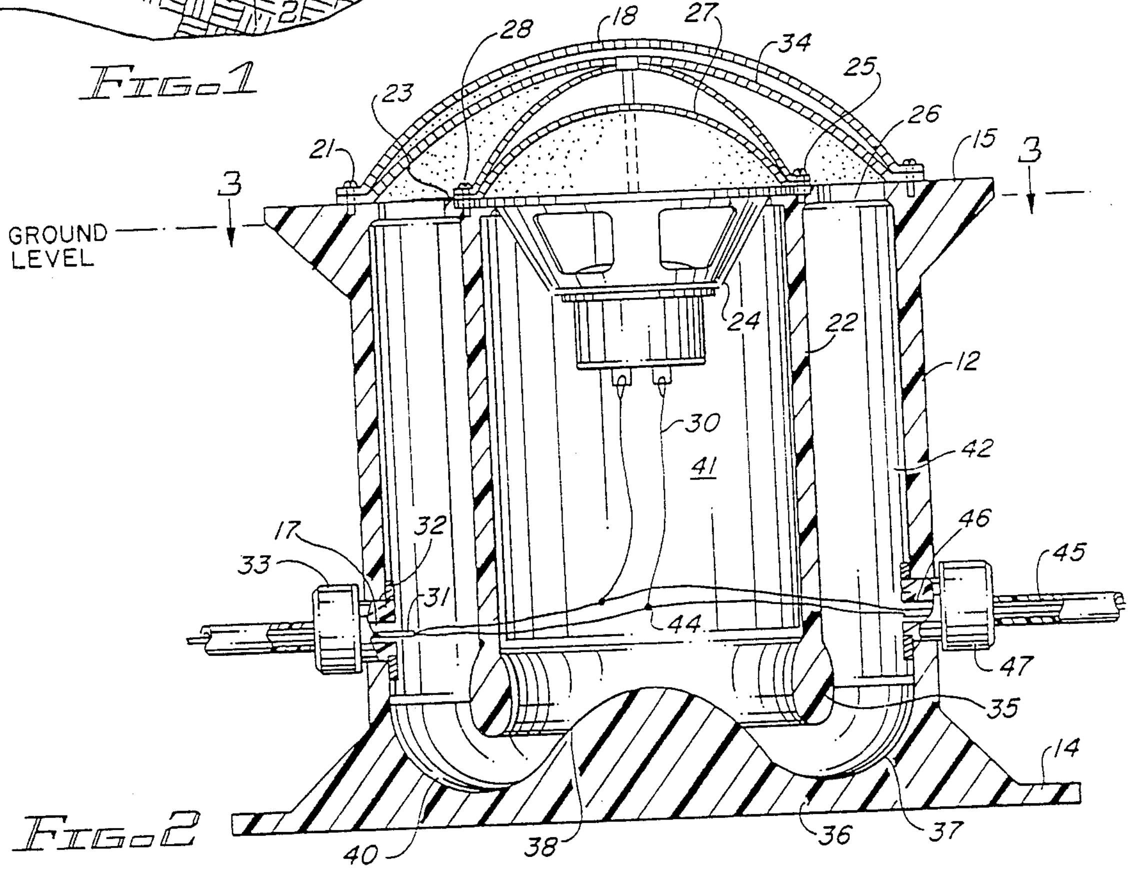
FIG. 2 is a sectional view taken on a line 2—2 of FIG. 1.

FIG. 4 illustrates the protective cover 18 which has a metal, such as aluminum, having solid portions 48 with a plurality of openings 50. The aluminum dome has opening sized to act as an acoustical lens for dispersing acoustical energy.

FIG. 3 illustrates the supporting member 23 and the openings 26 from the passageway 42 with the front 43 of the speaker 24 mounted therein.

The speaker system of the present invention provides sturdy support with the domed support cover 18 and prevents the ingress of materials by the membrane filter 34 while dispersing the higher frequencies emanating from the speaker 24. In addition the backwave is carefully controlled and ported from the speaker enclosure 12 in phase with the front of the speaker 24 to produce a better bass output. In addition the speaker is mounted in the earth 11 which earth supports the walls 12 which can be made of a lighter, waterproof, noncorosive, polymer material, such as a foamed polyurethane plastic. Vibration in the walls is prevented by the earth support. The present invention is accordingly not to be considered limited to the forms shown which are to be considered illustrative rather that restrictive.

I claim:

1. A waterproof audio speaker comprising:

a speaker housing having side walls and a pair of ends, one end being closed and the other end being open;

a hollow inner housing having walls and a pair of open ends and being mounted to said speaker housing with its walls in spaced relationship to the walls of said speaker housing, and forming a passageway between the walls of said inner housing and the walls of said speaker housing;

a loudspeaker mounted in said hollow inner housing facing one open end thereof, said speaker housing being a substatially cylindrical housing and said hollow inner housing being a substatially cylindrical housing, and said speaker housing having an annular grooved bottom formed with a protruding knob in the center of said groove and said inner housing having one end protruding into said annular groove to form an annular arcuate passageway between said inner housing and the passageway between said inner housing and speaker housing; whereby the backwave of said speaker is ported through said inner housing and through the passageway between the walls of said inner housing and the walls of said speaker housing to the open end of said speaker enclosure;

a supporting cover extending over the open end of said speaker housing; and a filter membrane cover extending over the open end of said speaker housing under said supporting cover for blocking the ingress of fluids and materials into the speaker housing.

2. A waterproof audio speaker in accordance with claim 1 in which said speaker housing has an earth supporting flange extending from said speaker housing.

3. A waterproof audio speaker in accordance with claim 2 in which said speaker housing earth supporter flange includes an annular flange around the open end of said speaker housing.

4. A waterproof audio speaker in accordance with claim 3 in which said speaker housing has said inner housing supported thereto by a plurality of support members.

5. A waterproof audio speaker in accordance with claim 1 in which said filter membrane is a laminated TEFLON sheet membrane.

6. A waterproof audio speaker in accordance with claim 5 in which said supporting cover is an aluminum having a plurality of openings therein sized to form an acoustical lens thereof.

7. A waterproof audio speaker in accordance with claim 5 in which a rigid frame extends over one end of said speaker housing to support said filter membrane.

8. A waterproof audio speaker in accordance with claim 1 in which the bottom edge of said inner housing is an annular enlarged portion to thereby form a rounded passageway between said inner housing and said passageway between said speaker housing and said inner housing.

9. A waterproof audio speaker in accordance with claim 8 in which said speaker housing has at least one opening through said housing wall for the passage of speaker wire.

10. A waterproof audio speaker in accordance with claim 9 in which said opening in said speaker housing wall has a threaded protruding portion extending from the exterior of the speaker wall and includes a threaded cap for sealing said wall opening.

11. A waterproof audio speaker in accordance with claim 1 in which said support cover is a domed rigid metal cover having a plurality of openings thereinto forming an audio lens for dispersal of sound.

12. A waterproof audio speaker in accordance with claim 1 in which said inner housing has a rigid domed cover having a plurality of openings therein extending over said speaker end thereof.

* * * * *